(12) United States Patent
Anderson et al.

(10) Patent No.: US 6,348,870 B1
(45) Date of Patent: Feb. 19, 2002

(54) MELT SPILL INDICATOR DEVICE

(75) Inventors: Douglas G. Anderson, Vancouver; Richard M. Aydelott, Ridgefield, both of WA (US)

(73) Assignee: SEH America, Inc., Vancouver, WA (US)

( * ) Notice: Subject to any disclaimer, the term of this patent is extended or adjusted under 35 U.S.C. 154(b) by 0 days.

(21) Appl. No.: 09/753,061

(22) Filed: Dec. 28, 2000

(51) Int. Cl.$^7$ ................................................ G08B 21/00
(52) U.S. Cl. ...................... 340/605; 340/604; 340/584; 340/593; 117/11
(58) Field of Search ................................ 340/604, 605, 340/584, 593; 117/11

(56) References Cited

U.S. PATENT DOCUMENTS

| | | | |
|---|---|---|---|
| 4,805,662 A | 2/1989 | Moody | 340/625 |
| 5,188,143 A | 2/1993 | Krebs | 340/605 |
| 5,334,973 A | 8/1994 | Furr | 340/605 |
| 5,858,486 A * | 1/1999 | Metter et al. | 117/13 |
| 5,923,259 A * | 7/1999 | Lederer | 340/605 |
| 6,254,673 B1 * | 7/2001 | Johnson et al. | 117/13 |

\* cited by examiner

*Primary Examiner*—Daniel J. Wu
(74) *Attorney, Agent, or Firm*—Douglas G. Anderson

(57) ABSTRACT

An apparatus for determining a melt spill during Czochralski crystal growing processes, having a sensor or detector that allows the creation or cessation of a signal when the presence of melt spill is detected. This invention includes a sensor or detector that can operate in high temperature conditions without causing contamination to the crystal growth process. Any detected melt spill triggers an alarm so that potentially dangerous and costly situations may be avoided. The melt spill detector may be placed in any location advantageous to detect the melt spill, and may be incorporated into the components of the crystal growing apparatus.

9 Claims, 2 Drawing Sheets

MELT SPILL INDICATOR DEVICE

FIELD OF THE INVENTION

This invention is directed to the field of semiconductor crystal growth, and more particularly to an apparatus for detecting spills of molten material during Czochralski crystal growth processes.

BACKGROUND OF THE INVENTION

The Czochralski crystal growing technique is commonly used to commercially grow bulk semiconductor single crystals such as silicon crystals. Typically, the semiconductor sub-material used for crystal growth comes in chunks or rocks of varying size up to approximately four inches in diameter. The sub-materials are loaded into a quartz crucible, and the crucible is loaded into the crystal growing apparatus. The semiconductor sub-material is then heated under controlled pressure and temperature, to the point where the sub-material becomes molten, typically above 1425° C., and as high at 1450° C. The heater used for the process is cylindrical in shape, and surrounds the crucible. Typically, either the heater, the crucible, or both are capable of vertical movement such that heat can be directed at exact locations. Because of this, it is common for the area below the crucible to be many degrees cooler than at the crucible. This temperature variation is further enhanced by an inert vent gas being flushed through the crystal growing apparatus, such that relative cooling of several degrees occurs a very short distance away from the area directly affected by the heater.

During crystal growth, a seed crystal is lowered into the molten sub-material and slowly extracted, thereby generating crystal growth. During extraction, the crucible and the seed crystal are rotated at controlled speeds to promote crystal stability. As molten sub-material is consumed in crystal growth, the crucible is raised to maintain the surface of the molten sub-material in an exact location. The heater is also adjusted to provide heat at the necessary locations.

During the process of melting the sub-material, an operator may monitor the crucible through a viewing port. The view is quite restricted, however, and only allows a view of the top surface of the sub-material, and does not provide a view of the entire crucible. As the sub-material transforms from solid to liquid form however, the operator cannot accurately determine the liquid level of the molten material due to air pockets, floating chunks of sub-material, and the like. As such, there is no accurate way to monitor the volume of liquid contained within the crucible visually until the entire sub-material has become molten and the liquid has reached a state of equilibrium.

In the unlikely event that the crucible has a leak, there currently is no feasible way for the operator to determine that molten sub-material is leaking out of the crucible. A leak of the molten sub-material is a significant safety risk, and must be controlled. Since the growing apparatus and therefore the submaterial is heated above 1425° C., if the sub-material were to escape the confines of the crucible it could cause significant damage to the growing apparatus. Further, the apparatus has a water jacket around it for containing the heat within the growing chamber. If the molten sub-material were to breach the water jacket, a steam explosion would occur, causing significant damage to the growing apparatus and surrounding facilities, and very likely would cause significant harm to anyone in close proximity.

Because of the difficulty in monitoring the liquid level in the crucible during the melting process, it is possible to have a large spill of molten material without any indication or warning to the operator. Although a multiplicity of devices exist for detecting a leak in a container such as a hot water heater, these devices are limited in their application and cannot be applied to the detection of melt spills of molten semiconductor at such extreme temperatures.

In U.S. Pat. No. 4,805,662 Moody discloses and apparatus for detecting water leakage underneath a water container such as a hot water heater. This patent describes a leakage collector tray with a peripheral wall that extends upwardly several inches from the base. The collector tray contains a float-operated switch or sensor mounted on the peripheral wall of the leakage collector tray, and the tray is placed underneath the hot water heater. When the water tank develops a leak, water will leak out and collect in the leakage collector tray. Once the water level in the collector tray reaches the float or sensor, an alarm will activate, thereby giving notice of the leak.

Kerbs also discloses an apparatus for detecting water leakage underneath a water container such as a hot water heater in U.S. Pat. No. 5,188,143. This patent describes a flexible elongated sensor strip placed to encircle a ground area beneath the hot water heater. Types of sensors can be varied to require a determined level of water height to activate the alarm.

In U.S. Pat. No. 5,334,973, Furr discloses a three-layered sensor that completely encases a hot water tank, and detects leaks anywhere on the tank. The first layer is nonconductive material that becomes conductive when it absorbs moisture. The second layer is a conductive layer, and the third layer is used as a containment layer that is neither conductive nor absorbent. When a leak occurs, the first layer of the sensor absorbs the moisture and completes an electrical circuit with the second layer, which activates an alarm system.

None of these patents, however, are capable of monitoring molten semiconductor spills due to the extreme environment found within the crystal growing equipment; particularly the extremely high temperatures. Further, each of these leak detection systems are designed to be placed outside of the container, and therefore the liquid must leave the confines of the container to be detected. In the case of crystal growth, these methods could not be utilized due to the safety hazards involved with the elevated temperatures of the molten semiconductor material.

Therefore, a need exists for an apparatus that can detect a melt spill of a molten semiconductor material that can withstand extreme temperatures, be located within the crystal growing apparatus while maintaining cleanliness of the growing environment, and warn an operator of the spill quickly and effectively.

SUMMARY OF THE INVENTION

The present invention provides an apparatus for detecting a spill of molten material during the melt preparation and crystal growth steps of semiconductor crystal manufacture. Any spill of molten material is a dangerous situation. Therefore, the embodiments of the present invention relate to detection of a melt spill, regardless of spill size, in a likely area where the spill will be present. Typically, a molten semiconductor material in a growing apparatus is contained within a quartz crucible. The quartz crucible is in turn held by a two-piece graphite susceptor, which in turn sits in a susceptor cup, holding the susceptor pieces together. These parts and the physical area wherein they are housed in the growing apparatus are often called "hotzone" areas or components. Because of the extreme temperatures involved with the process, the quartz crucible becomes somewhat elastic, and therefore must be held and supported by the graphite susceptor, which can better handle such high temperatures. Since the susceptor, however, is two pieces with a separation running top to bottom, it must be held by the susceptor cup. The susceptor cup has very short side walls, and is primarily used to hold and keep the susceptor together. In this arrangement, if a crucible fails, the leak will run down between the outer wall of the crucible and the inner wall of the susceptor to the bottom of the crucible-susceptor interface. The leaked molten material will then seep through the separation between the two susceptor halves, and flow into the susceptor cup. The susceptor cup is shallow, and is filled with the susceptor itself, therefore not being able to hold or contain material that has leaked out of the crucible. The leaked molten material will then flow out of the susceptor cup and fall to other parts of the crystal growing apparatus, causing damage to everything it touches and potentially causing a very serious safety hazard.

Accordingly, it is among the primary objects of the present invention to provide a novel melt spill detector which is detachably coupled to an audible and/or visual alarm.

Another object of the present invention is to provide a novel melt spill detector which will operate in the high-temperature environment of a crystal growing apparatus without contaminating the crystal growing environment.

Yet another object of the present invention is to provide a novel low-cost melt spill detector that may be placed in any location advantageous to detect the melt spill.

In one embodiment, the sensor or detector includes a layered pad of alternating insulative and conductive material that allows the creation or cessation of an electric signal when the presence of melt spill is detected. The detector may work as a continuous voltage or electrical signal which would be interrupted by the contact or presence of melt spill, or by remaining an open circuit until the conductive melt spill comes in contact with the detector, creating a closed circuit. Upon detection of the melt spill, an audible and/or visual alarm attached to or incorporated into the crystal growing apparatus will warn of the melt spill.

In another embodiment, a thermocouple may be placed in the position where leaked molten material would collect, and detect the increased temperature of the leaked molten material when in contact with the thermocouple. The thermocouple would then trigger an audible and/or visual alarm attached to or incorporated into the crystal growing apparatus, giving warning of the melt spill.

The apparatus according to the embodiments of the present invention can provide immediate detection of the melt spill during the melt down and crystal growing processes. The apparatus is an improved safety feature for the operator and can prevent the costly repair or replacement of a crystal growing apparatus.

DETAILED DESCRIPTION OF THE INVENTION

The present invention will now be described more fully hereinafter with reference to the accompanying drawings, in which preferred embodiments of the invention are shown. This invention may, however, be embodied in many different forms and should not be construed as limited to the embodiments set forth herein. These embodiments are provided so that disclosure will convey the scope of the invention to those skilled in the art.

Figure 1:
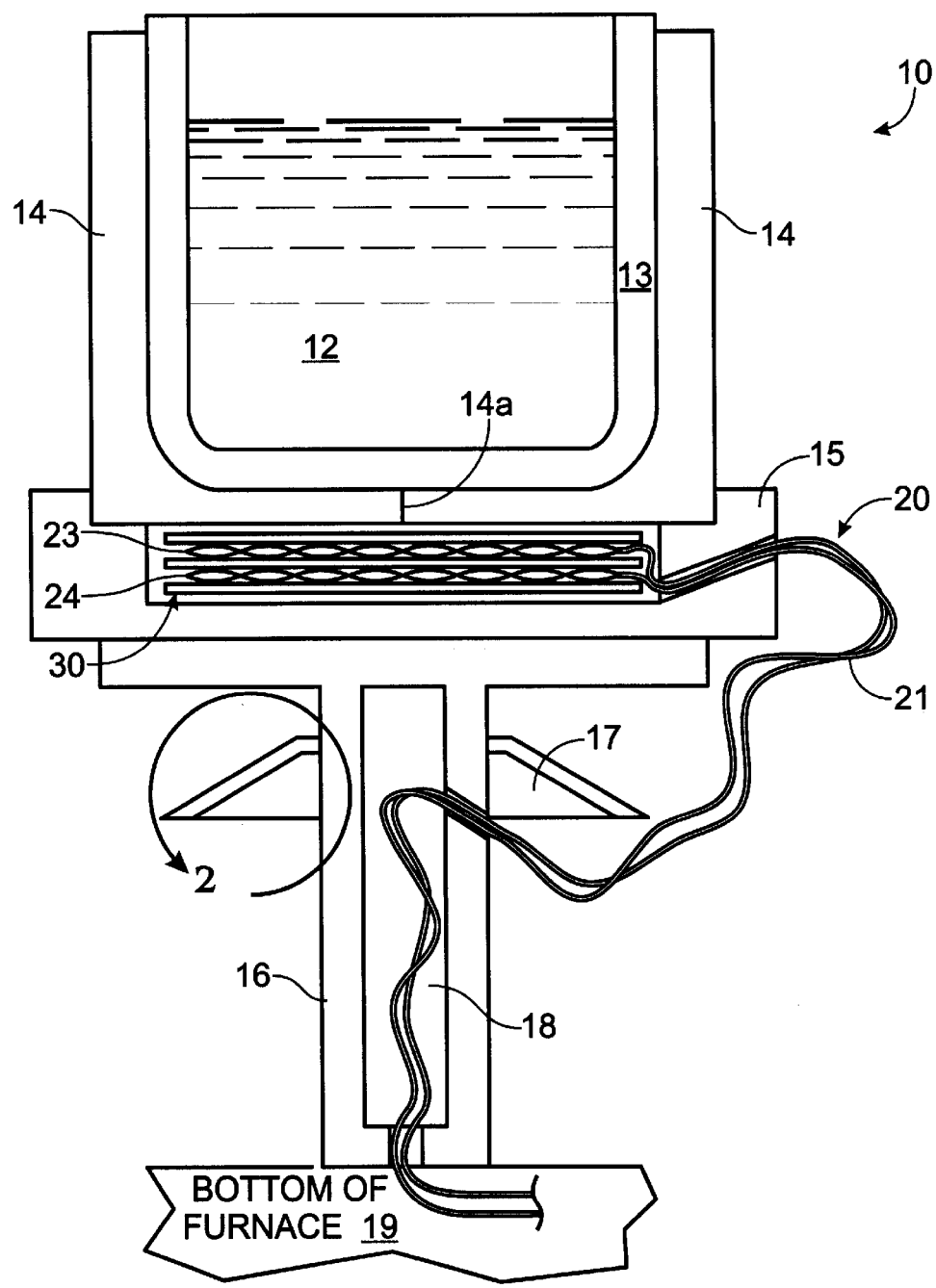
FIG. 1 is a front view of a crystal growing apparatus incorporating the novel melt spill detector of the present invention located in the susceptor cup.

Turning now to the drawings, FIG. 1 shows a conventional hotzone of a crystal growing apparatus indicated by the reference numeral 10, which comprises a crucible 13, typically formed of quartz. The crucible 13 is completely surrounded and supported by a two-piece graphite susceptor 14, which is joined at joint 14a. The susceptor 14 is in turn held together and supported by a susceptor cup 15, which is supported and rotated by a pedestal shaft 16. A molten semiconductor material 12 is contained within the crucible 13. A spill guard 17 is attached to the pedestal shaft 16. In the event of a spill of the molten material 12, the spill guard 17 will keep the spilled molten material from seeping out of the bottom of the furnace 19 where the pedestal shaft 16 penetrates the furnace bottom 19.

Figure 2:
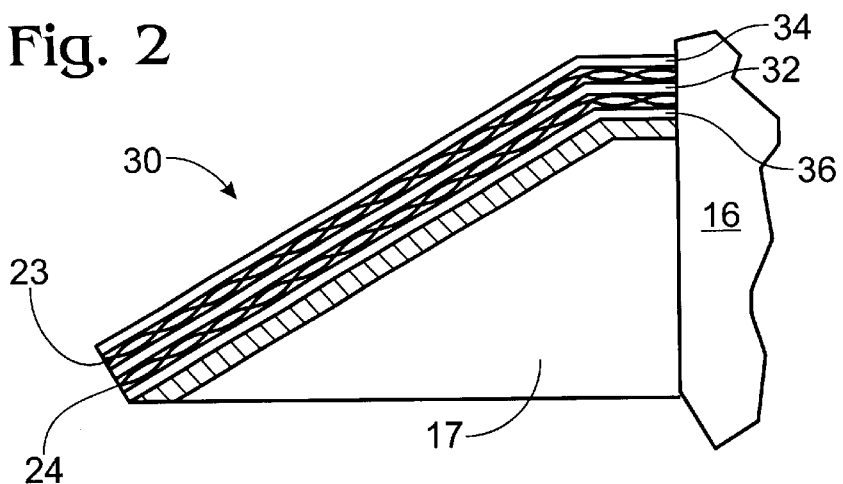
FIG. 2 is a front view of the novel melt spill detector of the present invention located on the spill guard.

In one preferred embodiment, the spill detector, generally indicated by the reference numeral 20, includes a pad or plate-like detector 30 housed within the vertical walls of susceptor cup 15. Electrical connectors 23 and 24 connect the detector 30 to a heat resistant wires 21 which run through a void 18 in the pedestal shaft 16, out through the bottom of the furnace 19, and to an alarm circuit (not shown). Alternately, as shown in FIG. 2, the detector 30 can be mounted on the top surface of spill guard 17, with all electrical connections remaining the same.

General procedures for crystal growth include loading the crucible 13 with chunks of semiconductor sub-material (not shown) which, when melted, becomes molten material 12. Currently, industry trends call for 125 kilograms of semiconductor submaterial being loaded in a crucible 13, and it is expected that sub-material amounts will increase in the future. Under the stress of the sub-material and/or mishandling of the crucible 13, the crucible 13 may become cracked or damaged. A damaged crucible may allow a leakage or a spill of molten material 12. In such a case, the leaked material will flow between the outer wall of the crucible 13 and the inner wall of the susceptor 14 down to the joint 14a. The joint 14a will allow the leaked molten material to flow through it and into the susceptor cup 15. With the use of the spill detector 20, the molten material will flow onto the detector 30. Depending on the size of the damage to the crucible 13, the leak rate of the molten material can be slow or fast. The molten material 12 will continue to leak until the temperature of the crystal growing apparatus is lowered to a temperature sufficient to let the molten material 12 solidify, or until all the molten material 12 has escaped the crucible. In the present invention, when leaked molten material contacts the detector 30, a signal is sent through the heat resistant wires 21 to the alarm circuit (not shown), and activates an alarm. The operator then can immediately lower the temperature to the crystal growing apparatus to a temperature below the melting point of the semiconductor sub-material, causing it to solidify and stop leaking, thereby preventing injury and further damage to process equipment.

Figure 3:
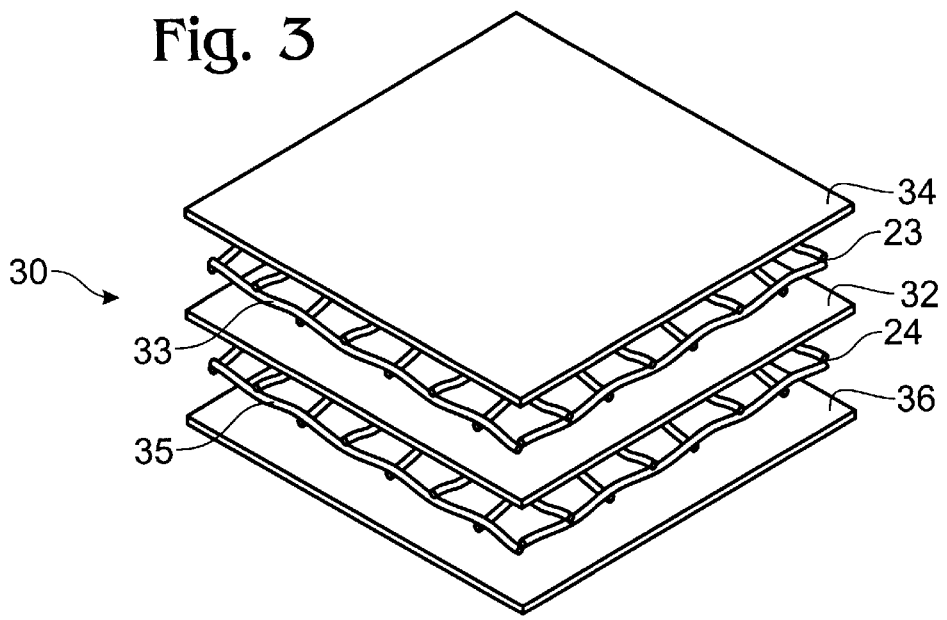
FIG. 3 is a perspective view of the melt spill detector utilized in FIG. 1.

Referring now to FIG. 3, an enlarged view of the detector 30 is illustrated as comprising alternating insulative and conductive materials. A pair of conductor mesh pads or plates 33 and 35 which can withstand the temperature of the leaked molten material is separated by insulative material 32, and covered by the same insulative material at 34 and 36. As the conductive leaked molten material disposes between the conductor mesh pads or plates 33 and 35, an electrical circuit will be completed through the wire connectors 23 and 24 to supply power to the alarm circuit 50. The insulating pads 32, 34, and 36 which can also withstand the temperatures of the leaked molten material separate the conductor mesh pads or plates 33 and 35, but allow the conductive leaked molten material to pass. Alternatively, insulation pads or plates 32, 34, and 36 can be of material that can withstand the ambient temperatures of the hotzone, but not that of the leaked molten material. In this case, the leaked molten material will burn through the insulation pads or plates 32, 34, and 36, and complete the electrical circuit between conductor mesh pads or plates 33 and 35, thus supplying power to the alarm circuit (not shown).

Figure 4:
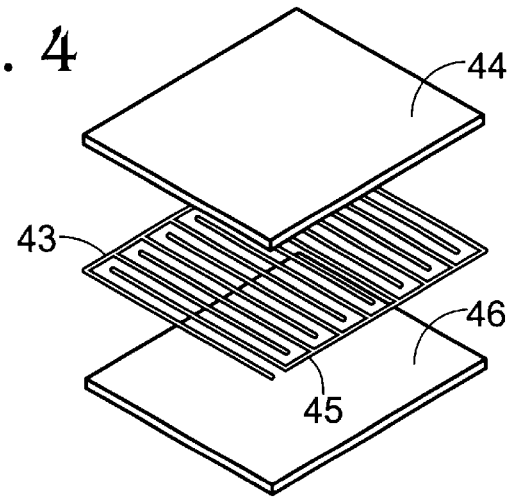
FIG. 4 is a perspective view of an alternative embodiment of the detector or sensor.

Now referring to FIG. 4, an enlarged view of an alternative embodiment of the present invention is illustrated as comprising a single layer of alternating sets of conductor wires 43 and 45 connected to wire connectors 23 and 24 respectively. This layer is placed between the insulation pads or plates 44 and 46. In this embodiment, and electrical circuit will be completed to supply power to the alarm circuit (not shown) when the conductive leaked molten material contacts both conductor wires 43 and 45. The conductor wires 43 and 45 can withstand the temperature of the leaked molten material. The insulation pads or plates 44 and 46 can withstand the temperature of the leaked molten material but allow the leaked molten material to pass through. Alternatively, insulation pads or plates 44 and 46 can be material that can withstand the temperature of the hotzone, but not that of the leaked molten material. In this case, the leaked molten material will burn through the insulation pads 44 and 46, and then contact the conductor wires 43 and 45 to complete the electric circuit and trigger the alarm circuit 50.

In yet another embodiment, an appropriate thermocouple (not shown), such as a B-type, R-type, or S-type thermocouple, can be used in place of the spill detector 20. In this embodiment, the thermocouple is placed either in the recess of the susceptor cup 15, or on the spill guard 17. In general, the thermocouple can be placed in any and all places leaked molten material is likely to pool, collect, or pass. In this embodiment, the thermocouple would transfer a continuous emf signal in millivolts to a control computer (not shown) of the crystal growing apparatus. The computer is set with an upper signal limit, and will trigger the alarm when the emf signal from the thermocouple exceeds that limit. The computer receiving this continuous emf signal is appropriately calibrated such that the standard operating temperature of the area below the hotzone where the melt spill indicator device would be placed would not trigger an alarm. When, however, the thermocouple comes in contact with the leaked molten material, detected by the additional heat accompanied by the leaked molten material, the change or increase in millivolts of the continuous emf signal would be interpreted by the computer as detecting leaked molten material. The computer would then trigger the alarm circuit (not shown).

It should be noted that without departing from the full scope of the embodiments of the present invention, one skilled in the art may choose from a variety of shapes and placement locations of the detector. Similarly, any appropriate materials that meet the requirements of the invention as described may be used. The melt spill detector system as a whole, or in part, may be relocated from one crystal growing apparatus to another. Furthermore, while the invention has been described in conjunction with a crystal growing apparatus, the use of this novel invention is not limited to that technology, but may be employed in any technology area where detection of high temperature molten material is needed. As such, the other embodiments of the present invention will be apparent to those skilled in the art from a consideration of this specification or practice of the invention disclosed herein. It is intended that the specification be considered in all aspects only as illustrative and not restrictive. The scope of the invention is, therefore, indicated by the appended claims rather than by the foregoing description. All changes which come within the meaning and range of the equivalence of the claims are to be embraced within their scope.

What is claimed is:

1. An crystal growth apparatus, comprising:
   a) a generally bowl-shaped crucible for containing a molten material;
   b) a generally bowl-shaped susceptor surrounding and supporting the outside of said crucible;
   c) a susceptor cup removably attached to the bottom of the susceptor, said susceptor cup providing stability and support to said susceptor;
   d) a melt-spill indicator located beneath said susceptor, such that any molten material leaked from said crucible would contact said melt-spill indicator; and
   e) an alarm electrically connected to said melt-spill indicator.

2. The crystal growth apparatus according to claim 1, wherein said melt-spill indicator is a thermocouple.

3. The crystal growth apparatus according to claim 1, wherein said melt-spill indicator comprises an open electrical circuit, said circuit closing and when coming in contact with leaked molten material, and triggering an alarm at the closing of said circuit.

4. The crystal growth apparatus according to claim 1, wherein said melt-spill indicator comprises a closed electrical circuit, said circuit opening when coming in contact with leaked molten material, and triggering an alarm at the opening of said circuit.

5. A melt spill detection apparatus for a molten material containing system, comprising:
   a) a sensor having alternating layers of electrically insulative and electrically conductive materials, wherein said insulative layer will allow leaked molten material to pass through said insulative layer and contact said conductive layer; and
   b) an alarm electrically connected to said sensor, wherein a leak of molten material will cause said sensor to activate said alarm.

6. The melt spill detection apparatus of claim 5, wherein said conductive layer is an electrically open circuit, said circuit closing when coming in contact with said leaked molten material.

7. The melt spill detection apparatus of claim 5, wherein said conductive layer is an electrically closed circuit, said circuit opening when coming in contact with said leaked molten material.

8. The melt spill detection apparatus of claim 5, wherein said conductive layer is a thermocouple.

9. The melt spill detection apparatus of claim 5, wherein said conductive layer remains mechanically and electrically stable at temperatures up to 1450° C.

* * * * *